US011695417B1

United States Patent
Winik et al.

(10) Patent No.: US 11,695,417 B1
(45) Date of Patent: Jul. 4, 2023

(54) ACTIVE NOISE CANCELATION IN SUPERCONDUCTING QUBITS USING CLOSED-LOOP FEEDBACK

(71) Applicant: Massachusetts Institute of Technology, Cambridge, MA (US)

(72) Inventors: Roni Winik, Somerville, MA (US); Antti Pekka Vepsalainen, Malden, MA (US); Simon Gustavsson, Cambridge, MA (US); William D. Oliver, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/652,577

(22) Filed: Feb. 25, 2022

(51) Int. Cl.
*H03K 17/92* (2006.01)
*G06N 10/40* (2022.01)

(52) U.S. Cl.
CPC ............. *H03K 17/92* (2013.01); *G06N 10/40* (2022.01)

(58) Field of Classification Search
CPC ............................... H03K 17/92; G06N 10/40
USPC .......................................................... 327/528
See application file for complete search history.

(56) References Cited

U.S. PATENT DOCUMENTS

| 6,984,846 B2 * | 1/2006 | Newns | B82Y 10/00 |
| | | | 977/933 |
| 10,692,009 B2 * | 6/2020 | Kelly | G06F 11/0751 |
| 2020/0380396 A1 * | 12/2020 | Raymond | G01R 23/16 |

FOREIGN PATENT DOCUMENTS

WO    WO 2020/019015 A1    1/2020

OTHER PUBLICATIONS

Shulman; "Suppressing qubit dephasing using real-time Hamiltonian estimation"; Nature Communications 5 (1): 5156 | DOI: 10.1038/ncomms6156; https://doi.org/10.1038/ncomms6156; 2014; 7 Pages.
Scerri, et al.; "Extending qubit coherence by adaptive quantum environment learning"; New J. Phys. 22035002; http://doi.org/10.1088/1367-2630/ab7bf3; Published Mar. 24, 2020; 13 Pages.
Nakajima, et al.; "Coherence of a Driven Electron Spin Qubit Actively Decoupled from Quasistatic Noise"; American Physical Society; Physical Review X 10, 011060 (2020); https://link.aps.org/doi/10.1103/PhysRevX.10.011060; Published Mar. 10, 2020; 11 Pages.

(Continued)

*Primary Examiner* — Tomi Skibinski
(74) *Attorney, Agent, or Firm* — Daly, Crowley, Mofford & Durkee LLP (57) ABSTRACT

A closed-loop feedback system and method of active noise cancellation to maintain a desired operating frequency of a qubit during a quantum computation, even when that frequency is relatively sensitive to flux noise. A series of Ramsey experiments is performed on the qubit to estimate an offset between its actual and desired operating frequencies, and the error is accumulated. After the probing is complete, the accumulated error is supplied to an arbitrary waveform generator that produces a magnetic flux that is coupled to the qubit, thereby tuning the qubit and actively controlling its operating frequency. Having corrected the operating frequency of the qubit and extended its coherence time, the quantum state of the qubit is allowed to evolve according to the computation.

15 Claims, 9 Drawing Sheets

(56) References Cited

OTHER PUBLICATIONS

Mavadia, et al.; "Prediction and real-time compensation of qubit decoherence via machine learning"; Nature Communications 8:14106 | DOI: 10.1038/ncomms14106; https://doi.org/10.1038/ncomms14106; Published Jan. 16, 2017; 6 Pages.

Majumder, et al.; "Real-time calibration with spectator qubits"; Nature Partner Journals Quantum Information (2020)6:19; https://doi.org/10.1038/s41534-020-0251-y; Published Feb. 7, 2020; 9 Pages.

Gustavsson, et al.; "Suppressing relaxation in superconducting qubits by quasiparticle pumping"; Science 354 (6319), 1573-1577; http://science.sciencemag.org/content/354/6319/157; Published Dec. 8, 2016; 6 Pages.

\* cited by examiner

ACTIVE NOISE CANCELATION IN SUPERCONDUCTING QUBITS USING CLOSED-LOOP FEEDBACK

STATEMENT REGARDING FEDERALLY SPONSORED RESEARCH

This invention was made with government support under W911NF-18-1-0218 and W911NF-18-1-0411 awarded by the Army Research Office. The government has certain rights in the invention.

FIELD

The disclosure pertains generally to quantum computing, and more particularly to physical realizations of systems and methods for qubit control.

BACKGROUND

A digital bit is a classical device whose state may be described as being in exactly one of two levels (typically denoted 0 and 1). By contrast, a quantum bit ("qubit") is a quantum-mechanical device whose state may be described as a mixture of two levels (typically denoted $|0\rangle$ and $|1\rangle$ ). Qubits may be broadly classified by the quantum phenomena to which they relate; charge qubits relate to electric charge quanta (i.e. electrons and holes), flux qubits relate to magnetic flux quanta (i.e. field lines), and phase qubits relate to a difference between complex phases of quantum wavefunctions. Qubits decohere (i.e. undergo state drift) as they interact with their environment.

Figure 1A:
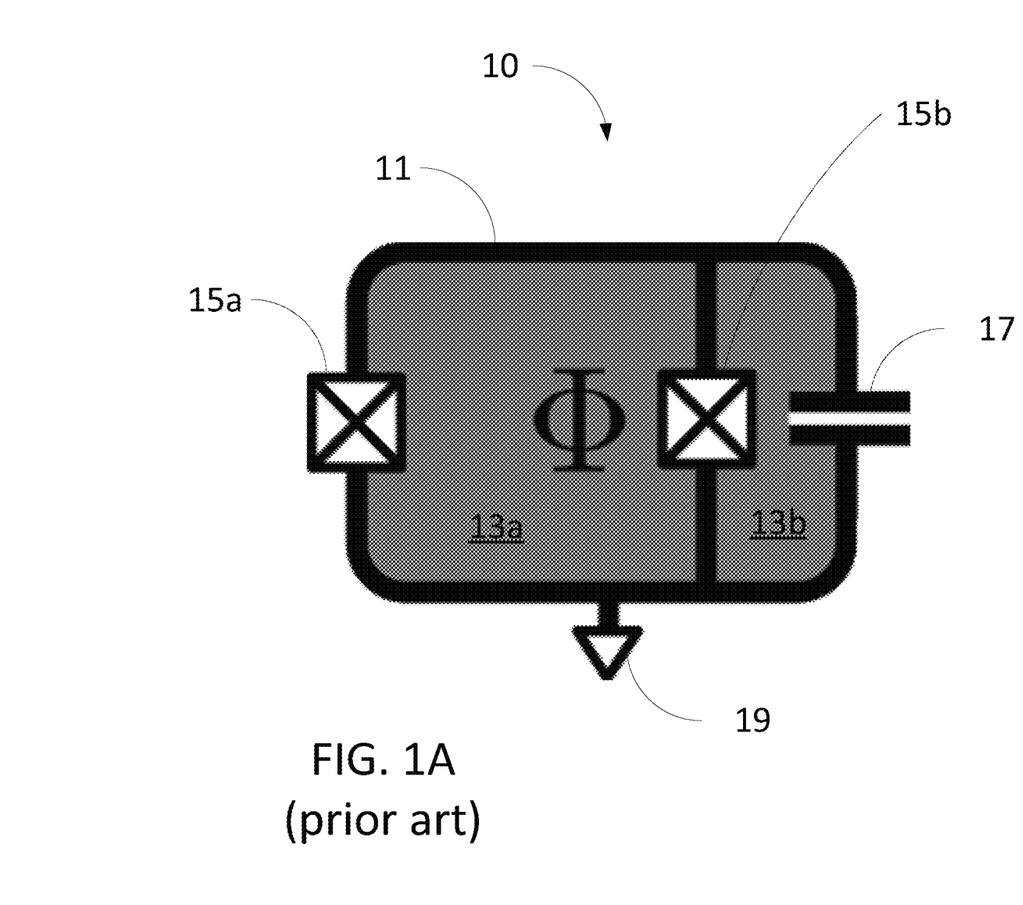
FIG. 1A shows a flux-tunable transmon as known in the art.

One way to mitigate the effects of noise is to design the qubits to be insensitive to the noise sources. In this connection, FIG. 1A shows a flux-tunable transmon 10, a circuit known in the art that implements a charge qubit that is relatively insensitive to charge noise. The flux-tunable transmon 10 includes a conductor 11, which is typically a superconducting wire. The conductor 11 forms two loops: a flux loop 13a for retaining a bias magnetic flux (denoted $\Phi$) and a noise-mitigation loop 13b. The top conductor 11 of the circuit forms a charge island, in which different numbers of electrons may be present, as determined by the bias flux, while the bottom conductor is grounded. To permit the bias flux to enter the flux loop 13a, the loop includes two Josephson junctions 15a, 15b. The transmon 10 includes a shunting capacitor 17 to increase the ratio of the energy $E_J$ of the Josephson junctions 15a, 15b to the charging energy $E_C$ of the circuit. Increasing this ratio decreases sensitivity to charge noise, thereby increasing the coherence times of the circuit.

Figure 1B:
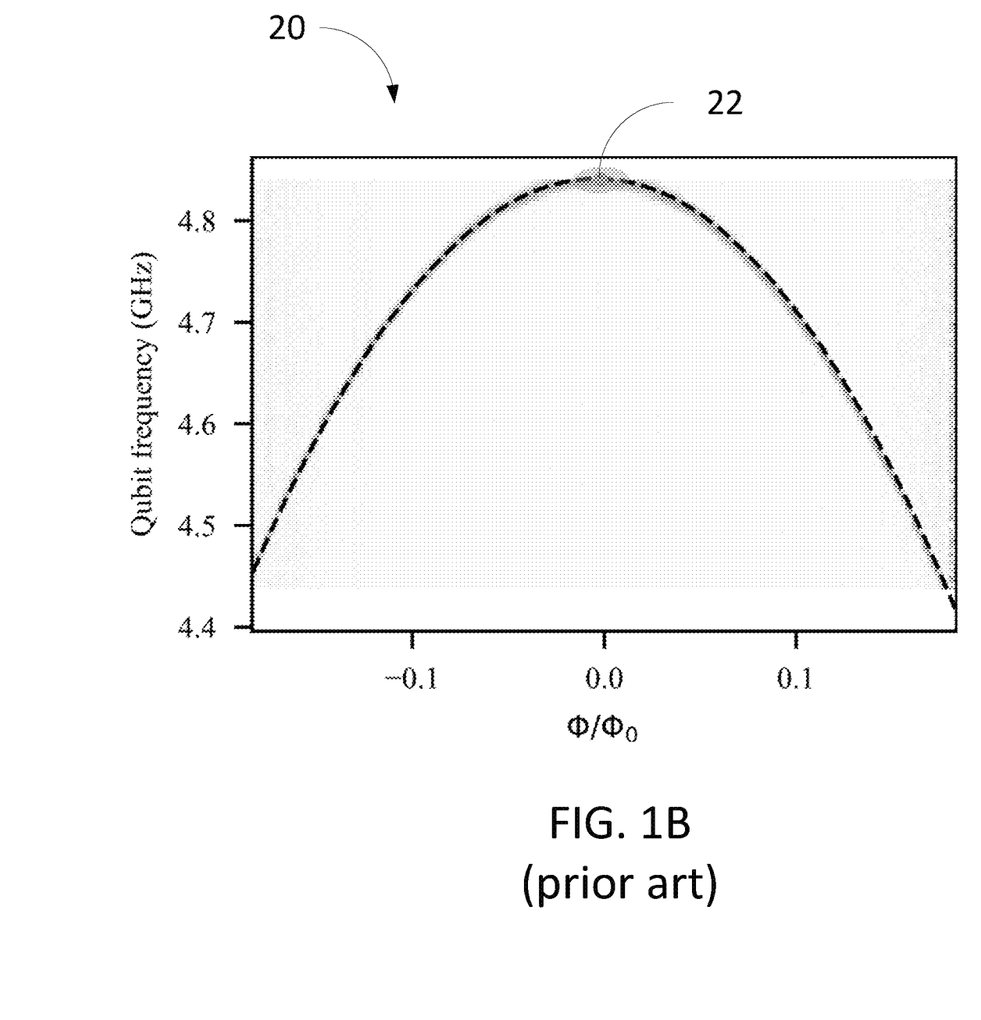
FIG. 1B shows operating frequency as a function of fractional flux noise $\Phi/\Phi_0$ for the transmon of FIG. 1A, emphasizing the "sweet spot"

Transmons such as the one shown in FIG. 1A typically also experience magnetic flux noise. To mitigate the flux noise, the transmon is usually operated at a flux bias $\Phi_0$ (colloquially called the "sweet spot") where it is first-order insensitive to small changes in flux. This has been a very successful strategy, resulting in qubits with coherence times typically ranging from 50 μs to 150 μs (microseconds). Graphically, FIG. 1B shows operating frequency as a function of fractional flux noise $\Phi/\Phi_0$ for a transmon made according to standard design. It may be appreciated from the plot 20 that, at the "sweet spot" 22, the qubit frequency (vertical axis) is first-order insensitive to small changes in flux (horizontal axis), as the slope of the curve, which measures first-order sensitivity, is zero there.

Figure 1C:
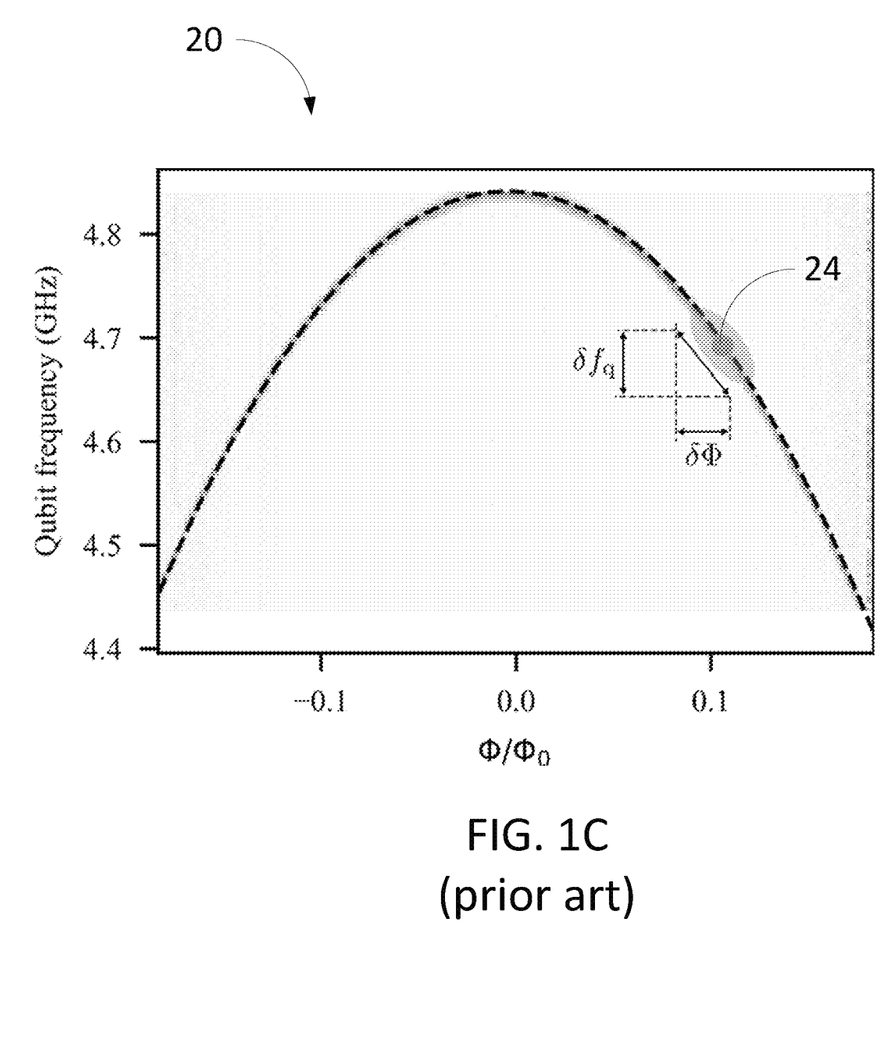
FIG. 1C shows the transmon of FIG. 1A tuned to a frequency away from the flux "sweet spot"

Contrast FIG. 1B with FIG. 1C, which shows a transmon tuned to a frequency 24 away from the flux "sweet spot". This "detuned" frequency shows much greater magnetic flux sensitivity, as indicated by the large (negative) slope of the plot 20 at the point 24, resulting in decreased coherence times. Still, operating a qubit at this frequency may be useful to avoid interactions with other qubits in a large system, or to avoid parasitic two level fluctuators. Therefore, there is a need to operate qubits at frequencies away from $\Phi_0$, while maintaining longer coherence times.

To determine the frequency at which a qubit is operating, one may probe the qubit using the technique of Ramsey interferometry. In a Ramsey experiment, a first pulse of complex phase π/2 at a given frequency (corresponding to a magnetic flux $\Phi$) is applied to the qubit, then a delay τ elapses to allow the qubit state to evolve, and finally a second pulse of complex phase π/2 is applied to the qubit. The net result is to project the state of the qubit onto one of the computational values $|0\rangle$ or $|1\rangle$. However, the frequency of the pulses will interfere with the frequency of the qubit to produce a phase offset for each Ramsey experiment, and fitting a curve to a plot of several such offsets over time can be used to indicate the average "beat" frequency $\Phi-\Phi_0$, i.e. the difference in frequency between the qubit's actual operating frequency and the "sweet spot".

SUMMARY OF DISCLOSED EMBODIMENTS

Disclosed embodiments provide a closed-loop feedback mechanism for suppressing frequency fluctuations due to magnetic flux noise, especially at operating qubit frequencies where the qubit is noise-sensitive, away from $\Phi_0$. The disclosed method of predictive feedback for noise cancelation involves three steps. First, we apply a quantum phase estimation algorithm that samples the qubit frequency as a function of time. We do that by tuning the qubit to its noise-sensitive point and performing a sequence of Ramsey measurements, which provides with the qubit frequency as a function of time. This results in a time-dependent estimation of the noise and the noise spectral density. In the second step, we apply a feedback correction to the qubit frequency using the qubit control lines. By adjusting the qubit frequency as a function of time, we can actively cancel out the noise that the qubit senses and thus increase the qubit coherence time. In the third step, we allow the qubit to evolve according to a desired quantum computation process. These three steps may be repeated as many times as necessary. To actively cancel the noise with an estimation-feedback sequence requires the feedback time to be short compared to the characteristic timescale of the noise dynamics. In our proposal we minimize the feedback time by performing the estimation-feedback using dedicated electronics with a field programmable gate array (FPGA). The resulting closed-loop feedback increases the qubit coherence time and reduce error rates.

Thus, a first embodiment is a closed-loop feedback system for maintaining a desired operating frequency of a qubit. The closed-loop feedback system includes a readout resonator that is capacitively coupled to the qubit, the readout resonator configured to produce a series of measurements of the operating frequency of the qubit. The system also includes a frequency estimator configured to receive the series of measurements and responsively produce an estimate of an offset between a measured operating frequency of the qubit and the desired operating frequency of the qubit. The system also includes an accumulator configured to receive the estimate of the offset and responsively produce an accumulated error signal. The system also includes an arbitrary waveform generator configured to receive the accumulated error signal and responsively generate a current. The system also includes an inductor that is inductively coupled to the qubit, the inductor receiving the generated current and responsively producing a magnetic flux, thereby actively controlling the operating frequency of the qubit.

Implementations may include one or more of the following features. The qubit may include a superconducting charge or flux qubit. The superconducting charge qubit may include a transmon. The readout resonator may include a Ramsey interferometer. The frequency estimator, or the accumulator, or both may include a field-programmable gate array (FPGA). The frequency estimator may be configured to produce the estimate of the offset by subtracting the measured operating frequency of the qubit from the desired operating frequency of the qubit. The frequency estimator may be configured to produce the estimate of the offset by further subtracting a sampling noise produced by the readout resonator.

Another embodiment is a method of maintaining a desired operating frequency of a qubit. The method of maintaining also includes producing a series of measurements of the operating frequency of the qubit. The method also includes estimating an offset between the measured operating frequency of the qubit and the desired operating frequency of the qubit. The method also includes producing an accumulated error signal using the estimate of the offset. The method also includes inductively coupling a magnetic flux to the qubit according to the accumulated error signal, thereby actively controlling the operating frequency of the qubit.

Implementations may include one or more of the following features. The qubit may include a superconducting charge or flux qubit. The superconducting charge qubit may include a transmon. Producing the series of measurements may include performing Ramsey experiments. Estimating the offset may include subtracting the measured operating frequency of the qubit from the desired operating frequency of the qubit. Estimating the offset may include further subtracting a sampling noise produced by a readout resonator making the series of measurements. The method may include allowing the quantum state of the qubit to evolve according to a portion of a quantum computation. The method may be performed repetitively until the quantum computation is complete.

It is appreciated that the concepts, techniques, and structures disclosed herein may be embodied in other ways, and that the above summary of disclosed embodiments is thus meant to be illustrative rather than comprehensive or limiting. In particular, individual elements of different embodiments described herein may be combined to form other embodiments not specifically set forth above. Various elements, which are described in the context of a single embodiment, also may be provided in other embodiments separately, or in any suitable sub-combination. Moreover, other embodiments not specifically described herein also may be within the scope of the claims set forth below.

DESCRIPTION OF THE SEVERAL VIEWS OF THE DRAWINGS

The manner and process of making and using the disclosed embodiments may be appreciated by reference to the drawings, in which.

DETAILED DESCRIPTION OF EMBODIMENTS

Figure 2:
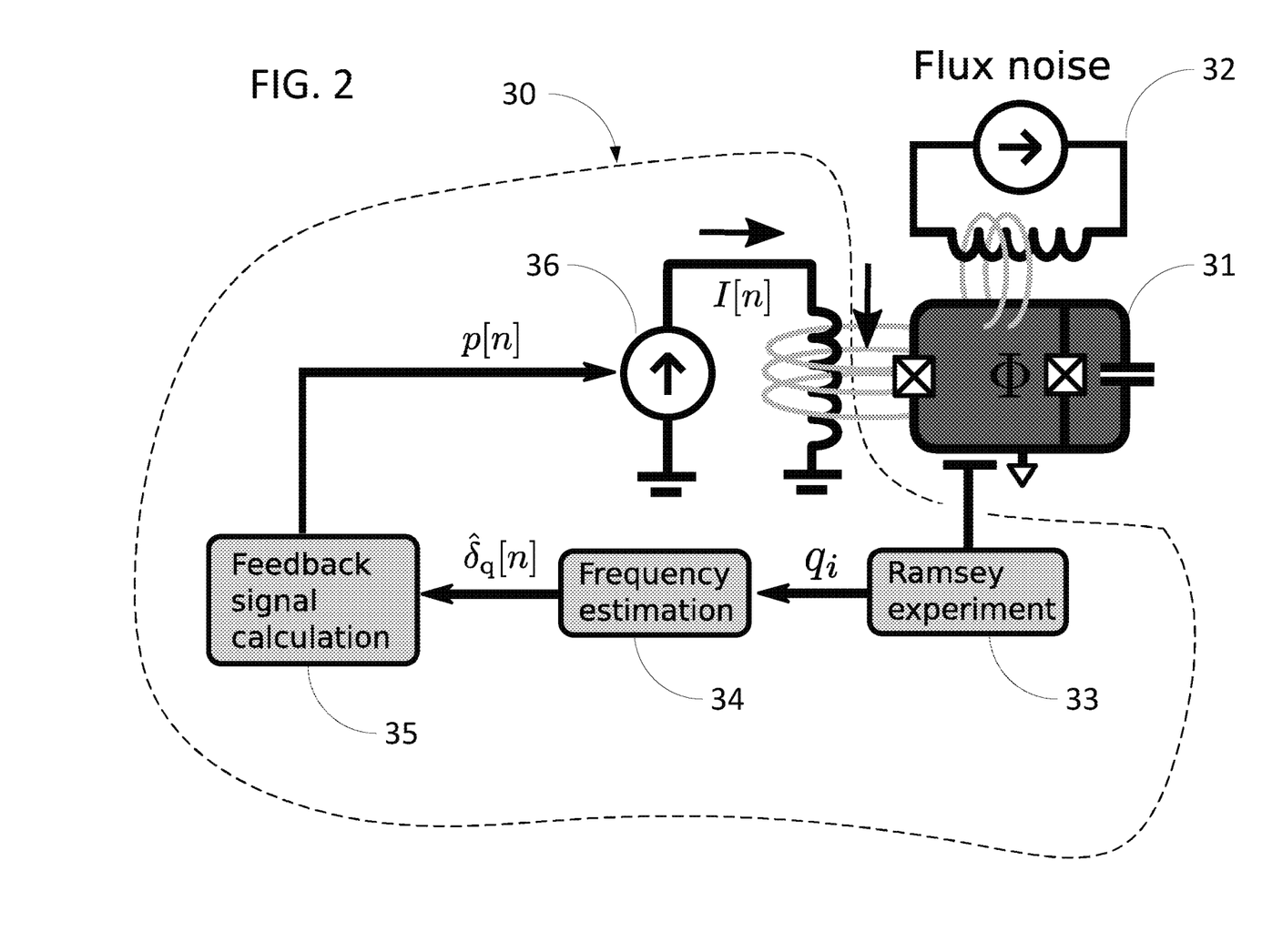
FIG. 2 shows a closed-loop feedback system for maintaining a desired operating frequency of a qubit, according to an embodiment.

FIG. 2 shows a closed-loop feedback system 30 for maintaining a desired operating frequency of a qubit 31, according to an embodiment. The qubit 31 shown is a transmon qubit, e.g. transmon 10, but it is appreciated that embodiments may be used with other superconducting qubits. It is assumed that the qubit 31 is relatively insensitive to charge noise, but that it experiences environmental magnetic flux noise which is modeled in FIG. 2 as a notional circuit producing flux noise 32 that is inductively coupled to the charge island of the qubit 31.

The qubit 31 ordinarily should be maintained within a desired operating frequency range. The desired operating frequency range in some situations may be away from the flux noise-insensitive "sweet spot" of the qubit 31; that is, a range around frequency 24 shown in FIG. 1C rather than a range around frequency 22 shown in FIG. 1B. Illustrative embodiments of the system 30 operate on the qubit 31 (as affected by the flux noise 32) to control its operating frequency.

The system 30 includes a readout resonator 33 that is capacitively coupled to the qubit 31. The readout resonator 33 is configured to produce a series of measurements of the operating frequency of the qubit 31. In illustrative embodiments, the readout resonator is a Ramsey interferometer, and the measurements are Ramsey experiments. Thus, the readout resonator 33 conducts N repeated Ramsey measurements of the qubit 31, where e.g. N=20. For each of those measurements, the qubit 31 is first prepared in a superposition state $|\psi\rangle = (|0\rangle + |1\rangle)/\sqrt{2}$ using a $\pi/2$ rotation around the x-axis of the Bloch sphere. This is followed by a period of free evolution for a duration $\tau$, during which the qubit state acquires a phase $\phi = 2\pi \int_0^\tau \delta_q(t) dt$, where $\delta_q(t) = f_d - f_q(t)$ is the detuning between a microwave drive frequency $f_d$ defining a rotating reference frame, and $f_q(t)$ is the fluctuating qubit frequency in the presence of noise. A second $\pi/2$ pulse is then applied around the y-axis, and the state of the qubit is measured using dispersive readout. To simplify the feedback protocol, we make a quasi-static approximation and assume that the qubit frequency remains constant within one frequency estimation experiment (N Ramsey measurements) but may fluctuate between the experiments. With this assumption, the probability of measuring the qubit in the excited state is given by $$p_1 = \frac{1}{2} + \frac{1}{2}\cos(2\pi\delta_q\tau - \pi/2),$$

which can be inverted to yield the frequency shift $$\delta_q = \frac{\pm \arccos(2p_1 - 1) + 2\pi k + \pi/2}{2\pi\tau},$$

where k is an integer. The latter equation is a one-to-one mapping from $p_1$ to the frequency detuning $\delta_q$ over the domain $\delta_q \in [-\frac{1}{4}\tau, \frac{1}{4}\tau]$. This implies the fluctuations in $\delta_q$ need to be within $\pm\frac{1}{4}\tau$ between the estimation steps, or approximately 70 μs in our experimental setup.

The system 30 also includes a frequency estimator 34. The frequency estimator 34 is configured to receive the series of measurements $q_i$ produced by the readout resonator 33, and to responsively produce an estimate $\hat{\delta}_q$ [n] of an offset between the measured operating frequency of the qubit 31 and the desired operating frequency of the qubit 31. In particular, the qubit excited-state probability estimator $$\hat{p}_1 = \frac{1}{N} \sum_{i=0}^{N} q_i$$

is calculated from the measurement record $q_i$ of N repetitions of the Ramsey sequence, providing an estimate for the frequency detuning of the qubit, $\hat{\delta}_q$ [n]. If in the previous measurement the qubit was measured to be in the excited state, we virtually reset the qubit state for the current repetition by flipping $q_i$. The duration of a Ramsey measurement in our experiment was T=3.5 μs, comprising the phase accumulation time τ=1.25 μs, the readout duration of 750 ns, and the combined resonator reset time and overhead from the electronics of 1.5 μs. Thus, a single round of frequency estimation takes $T_N$=NT=70 μs in our implementation.

The system 30 also includes an accumulator 35 configured to receive the estimate $\hat{\delta}_q$ of the frequency offset and responsively produce an accumulated error signal p[n] as a result of a feedback signal calculation. To estimate the noise power spectral density affecting the qubit frequency, we first bias the qubit away from the "sweet spot" by 0.11 flux quanta $\Phi_0$=h/2e, at a transition frequency $f_q$=4.69 GHz that is sensitive to flux noise, and repeatedly estimate its frequency many (e.g. $10^5$) times. The measured power spectral density follows a power law $$S_{f_q f_q} = A_{f_q} \left(\frac{1 \text{ Hz}}{f}\right)^\alpha \approx 27.3 \times 10^6 \text{Hz}^2/\text{Hz} \times \left(\frac{1 \text{ Hz}}{f}\right)^{0.8},$$

but starts to deviate at frequencies above 500 Hz for N=20 and T=1.25 μs. This is due to noise added by the finite number of samples in the estimate $\hat{\delta}_q$ and can be approximated as $$\delta\hat{\delta}_q \approx \frac{1}{2\pi\tau\sqrt{N}}.$$

The statistical sampling noise is modeled as Gaussian white noise with an upper cutoff given by the duration of the frequency estimation, $$S_{est}(f) = \begin{cases} \frac{T}{2\pi^2\tau^2}, & 0 \leq f \leq \frac{1}{2NT}, \\ 0, & \text{otherwise} \end{cases}.$$

The sampling noise can be suppressed in post-processing by cross-correlating time-shifted measurement traces, as known in the art. With the sampling noise suppressed, the measured power spectrum fits well to the power law across the whole bandwidth.

The accumulator 35 produces the feedback signal p[n] as follows. We aim to minimize the deviation of the qubit frequency $f_q(t)$ from the desired target frequency $f_d$ by using the offset $\hat{\delta}_q$ [n] as the error signal in the feedback loop. Here, we use n to number each time feedback is applied, sampled at times $t_n$=n$T_N$. In practice, the sampled error signal represents the average of the qubit frequency fluctuation during the sampling period $T_N$, limiting the maximum bandwidth of the feedback to 1/(2$T_N$)≈7 kHz if the time spent on the interleaved computation step is omitted. The error signal $\hat{\delta}_q$ [n] is multiplied by a controllable gain G and fed into an accumulator that controls the feedback signal, p[n]=p[n−1]+G$\hat{\delta}_q$[n]. In illustrative embodiments, we deliberately set G=0.35 to reduce the bandwidth of the feedback frequency response to be less affected by the statistical sampling noise. It is appreciated that other embodiments may use different values for the controllable gain G.

Figure 3:
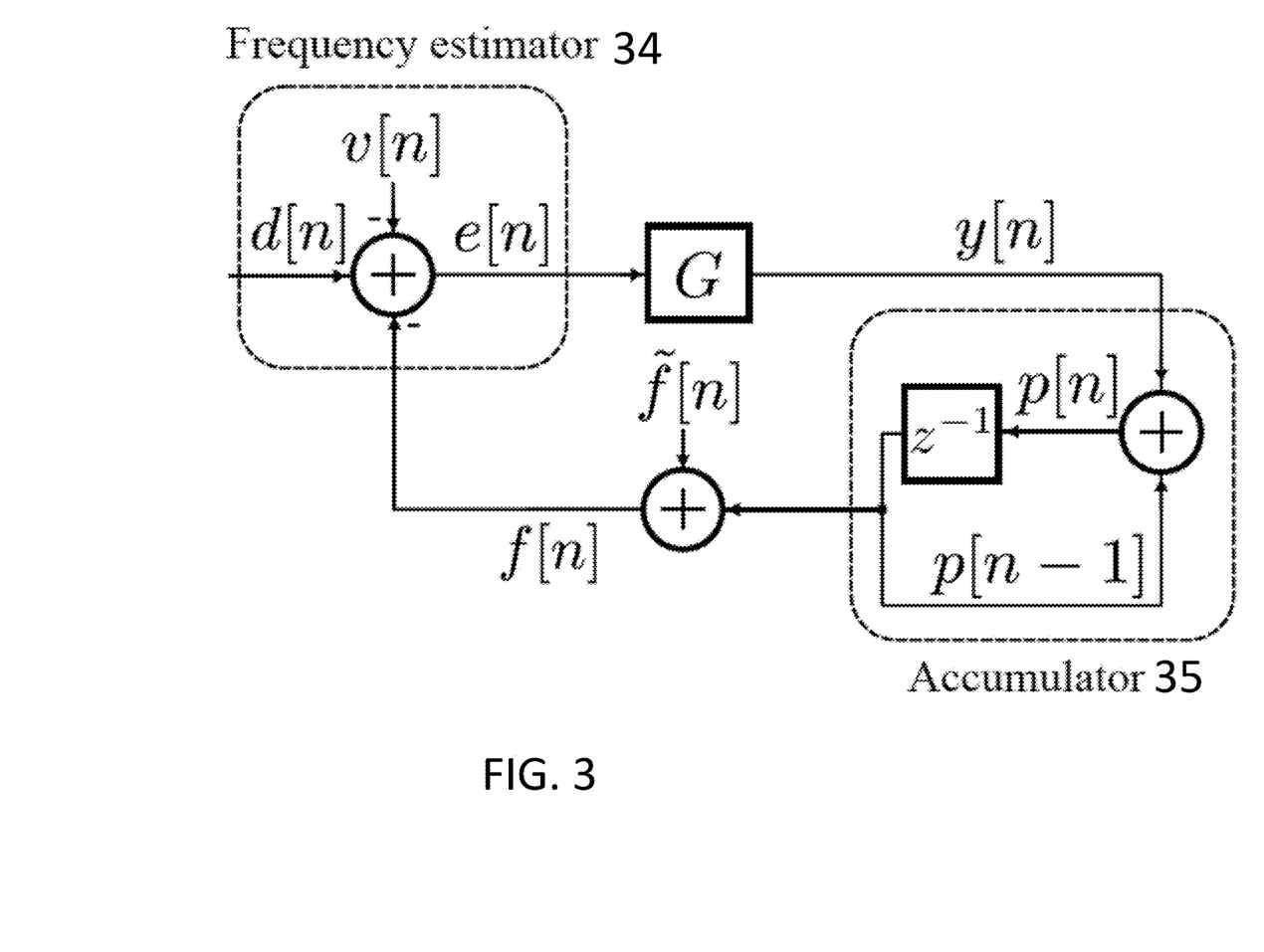
FIG. 3 illustrates the operation of a portion of the system of FIG. 2 that includes just the frequency estimator and accumulator.

FIG. 3 illustrates the operation of a portion of the system 30 that includes the frequency estimator 34 and accumulator 35. FIG. 3 uses the following notation: d[n]=$f_d$ is the target or desired operating frequency of the qubit 31, which is fixed; v[n] is the sampling noise; f[n] is the estimated operating frequency of the qubit 31; and $\hat{\delta}_q$ [n]=e[n]=d[n]−v[n]−f[n] is the error signal which represents the current frequency offset. Each of these values is determined during the nth correction cycle. As shown in FIG. 3 and described above, the error signal is multiplied by the controllable gain G and added in the accumulator 35 to produce the accumulated error signal. Finally, the estimated operating frequency of the qubit 31 is computed as f[n]=f̃[n]+p[n−1], where f̃[n] is the intrinsic fluctuating value of the qubit frequency.

Returning to FIG. 2, the system 30 also includes an arbitrary waveform generator (AWG) 36 that is configured to receive the accumulated error signal p[n] and responsively generate a current I[n]. The AWG 36 may be constructed using conventional techniques. Finally, the system 30 has an inductor that is inductively coupled to the qubit 31 as shown. The inductor receives the generated current I [n] and, as inductors do, responsively produces a magnetic flux. As this flux is coupled to the qubit 31, it actively controls the operating frequency $f_q(t)$ of the qubit 31, thereby forming a closed-loop feedback system. In sum, the output p[n] of the accumulator 35 is scaled and converted to an AWG 36 voltage that drives the current I[n] responsible for creating a magnetic flux through the qubit loop, adjusting its transition frequency. The feedback significantly reduces the noise spectral density of the error signal $\hat{\delta}_q$ [n].

After closing the feedback loop, the error signal $\hat{\delta}_q$ [n] provides only indirect information about the actual qubit frequency fluctuations, which are also affected by the frequency response of the feedback. Therefore, we employed a simulation to assess the impact of the feedback transfer function on stabilizing the qubit frequency $f_q(t)$. We used the fitted noise spectral density as the starting point of the simulation to generate time traces of the fluctuating qubit frequencies. Using the same parameters as in the experiment, we simulated the estimation of the qubit frequency and the feedback, which results in a time trace of estimated qubit frequencies. The power spectral density of the simulated qubit frequency estimation without the feedback matched the experiment almost perfectly. The simulated qubit frequency estimates when the feedback is turned on, again matched well with the experiment. Finally, using the simulation we were able to calculate the power spectral density of the real qubit frequency fluctuations when the feedback is applied.

Figure 4:
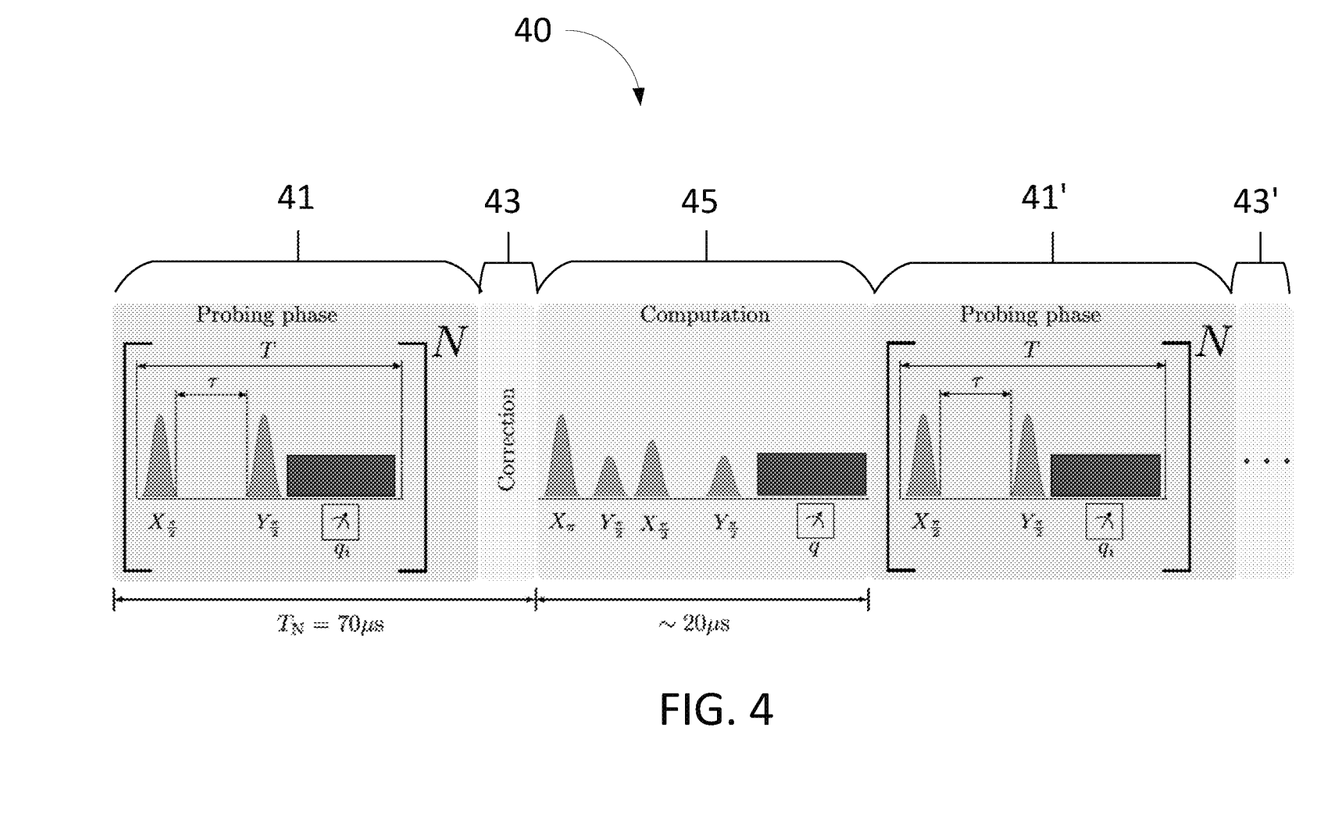
FIG. 4 is a cartoon timeline of a method of maintaining a desired operating frequency of a qubit according to an embodiment.

FIG. 4 is a cartoon timeline 40 of a method of maintaining a desired operating frequency of a qubit according to an embodiment. The qubit may be the qubit 31 subject to flux noise 32, and the method may be performed by the closed-loop feedback system 30, for example. However, it is appreciated that the method may be performed by other devices than those shown in FIG. 3, and while its processes are described below with reference to devices shown in FIG. 3 for concreteness, the method should not be viewed as limited to those devices.

The feedback protocol consists of three phases 41, 43, 45 that are continuously repeated. In the probing phase 41, the qubit frequency is estimated using a simple single-qubit frequency estimation algorithm. The frequency estimation is illustratively performed by conducting a series of Ramsey experiments using a Ramsey interferometer, such as readout resonator 33, together with a frequency estimator, such as frequency estimator 34. After the frequency of the qubit is estimated, the correction phase 43 adjusts the magnetic flux through the qubit to set the qubit frequency to its target value. Adjusting the magnetic flux is illustratively performed using the accumulator 35 and the AWG 36. This phase is followed by a computation phase 45, where an algorithm (e.g. for performing a quantum computation), or a portion thereof, can be run with a freshly stabilized qubit. These processes 41, 43, 45 may be performed repetitively until the quantum computation is complete. In FIG. 4, this is represented by the presence of a second probing phase 41' and a second correction phase 43', with the understanding that further phases are subsequently conducted.

Figure 5:
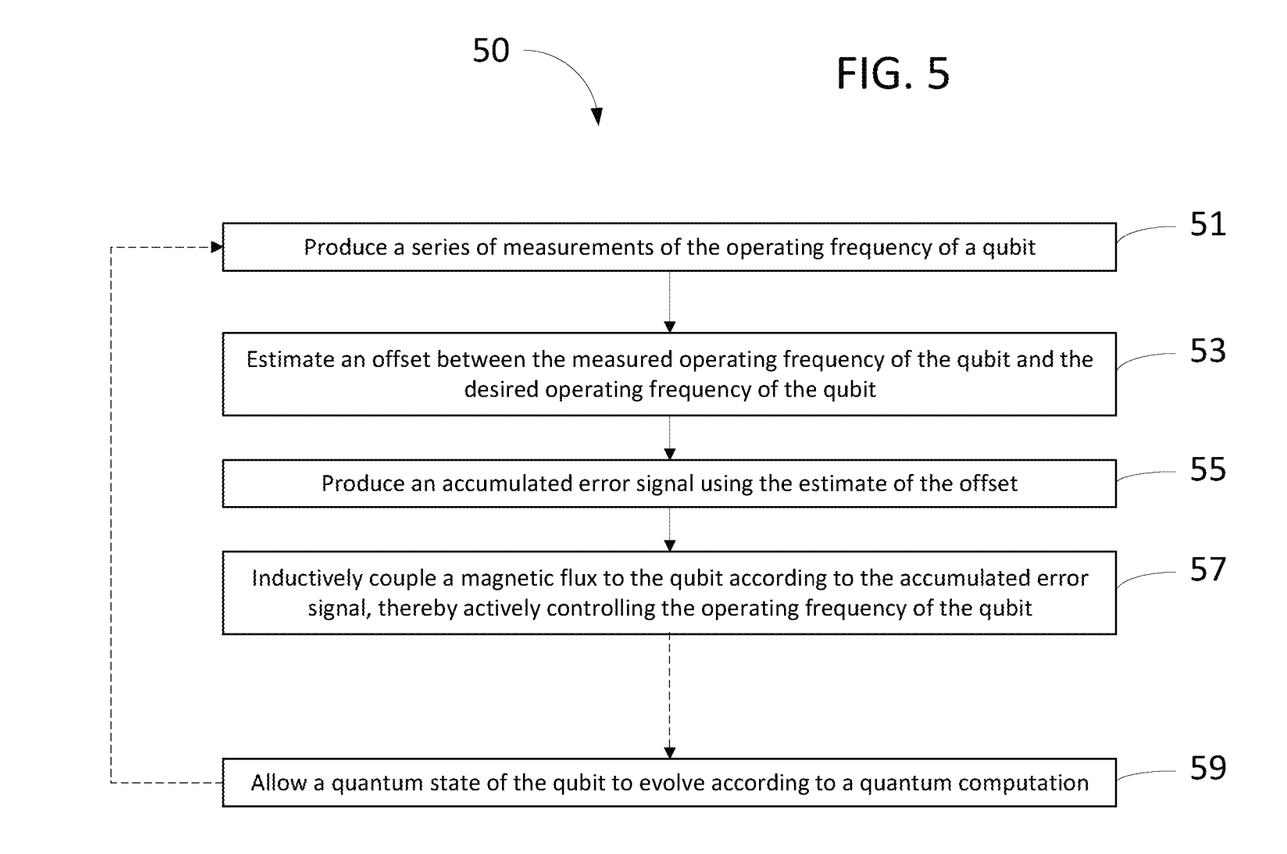
FIG. 5 is a flowchart showing the processes of the method of FIG. 4.

FIG. 5 shows a flowchart for a method 50 of maintaining a desired operating frequency of a qubit according to an embodiment. The qubit illustratively may be the qubit 31, which may be a superconducting charge qubit such as a transmon. The method includes a process 51 producing a series of measurements of the operating frequency of the qubit. The process 51 may be performed by the readout resonator 33, and may comprise Ramsey experiments performed by a Ramsey interferometer.

The method also includes a process 53 estimating an offset between the measured operating frequency of the qubit and the desired operating frequency of the qubit. The process 53 may be performed by the frequency estimator 34. As described above, estimating the offset typically includes subtracting the measured operating frequency of the qubit (as determined by the Ramsey experiments) from the desired operating frequency of the qubit. In some embodiments, such as that shown in FIG. 3, estimating the offset comprises further subtracting a sampling noise produced by the readout resonator making the series of measurements. The method 50 also includes a process 55 producing an accumulated error signal using the estimate of the offset. The process 55 may be performed by the accumulator 35, as described above. Collectively, the processes 51, 53, and 55 correspond to the probing phase 41, during which the process 51 is repeated N times, during which the offset is measured and the error is accumulated.

The method 50 further includes a process 57 inductively coupling a magnetic flux to the qubit according to the accumulated error signal, thereby actively controlling the operating frequency of the qubit. The process 57 may be performed by the AWG 36 and an inductor coupled to the qubit. The process 57 corresponds to the correction phase 43.

The method 50 optionally may include, as indicated by the dashed arrow, a process 59 allowing a quantum state of the qubit to evolve according to a portion of a quantum computation. The process 59 corresponds to the computation phase 45. As suggested by FIG. 3 and its description above, and as indicated by the second dashed arrow, the method 50 optionally may include performing repetitively the processes 51-59 in a loop until the quantum computation is complete.

Embodiments of the concepts, techniques, and structures disclosed herein have several advantages over the prior art, including an increased qubit coherence time $T_2$ for a range of flux biases, and improved, single-qubit gate fidelity. These advantages are now discussed in more detail.

We first demonstrate that the lower noise power of an embodiment increases the qubit coherence time $T_2$. We apply two $\pi/2$ pulses around the y-axis of the Bloch sphere, and sweep the delay between the pulses, $\tau_R$. For a Gaussian-distributed noise process, the envelope of the Ramsey oscillations decays as $$\chi_R(t) = \exp\left[-2t^2\pi^2 \int_{f_0}^{\infty} S_{f_q f_q}(f)\mathrm{sinc}^2(\pi f t)df\right],$$

where $S_{f_q f_q}(f)$ is the unilateral power spectral density of the frequency fluctuations and $f_0$ is the lower cutoff frequency equal to the inverse of the total duration of the experiment. We fit the experimental data to an oscillating function with a decay envelope corresponding to a power spectral density of 1/f noise and extract the coherence time from when the decay envelope drops below 1/e from its original value at $t_R=0$. The feedback increases the coherence time from $T_2=6.2$ μs to $T_2=7.7$ μs, or 26%.

The observed improvement in coherence time was consistent across several repetitions of the experiment. The fitted decay envelope can be compared to a theoretical estimate obtained by directly substituting the measured power spectra to the above envelope equation, closely matching experimentally observed decay envelopes. The only fit parameter is the qubit state initialization fidelity, 92%, which scales the decay envelope amplitude. This confirms that the decoherence of the qubit is well described by the measured power spectral density of the frequency fluctuations.

The inferred coherence time of the qubit depends on the total duration of the Ramsey experiment through the cutoff frequency $f_0$ in the above equation. The coherence time $T_2$ is evaluated using different numbers of averages to calculate $p_1$, thereby changing the total duration of the single Ramsey experiment and the cutoff frequency $f_0$. The data from the experiment is collected only once, and is sectioned to different numbers of averages as postprocessing. Without the feedback, the coherence time gradually decreases as the duration of the experiment increases. This is due to the increased noise power at lower frequencies for 1/f noise. When the feedback is activated, the overall coherence time is increased, and remains constant independent of the cutoff frequency $f_0$ due to the elimination of the low frequency noise. Moreover, the qubit frequency remains stable during the measurement, as inferred from the frequency of the Ramsey oscillations during the experiment.

The stability of the qubit frequency can be maintained for hours using the feedback protocol. Ramsey experiments were repeated for more than four hours, either with the feedback turned off or on. When the measured qubit excited state populations were overlaid, the Ramsey oscillations without the feedback were blurred due to the constant fluctuation in the qubit frequency, whereas with the feedback the oscillations were clearly visible. The coherence time extracted from the average of all uncorrected (feedback off) Ramsey experiments was only $T_2=2.1$ µs, compared to $T_2=6.9$ µs with the feedback.

Thus far, we have described operating the qubit at a fixed flux bias point. We next demonstrate that the feedback protocol improves the coherence time for a range of flux biases. The sensitivity of the qubit to the flux noise is determined by the curvature of its frequency spectrum with respect to flux bias, allowing us to probe the efficiency of the feedback at various noise levels and intrinsic coherence times. We evaluated the pure dephasing rate of the qubit at 11 different bias points, first without the feedback and then with it on. The pure dephasing rates were extracted from the decay of the Ramsey oscillations by subtracting the effect of the energy-relaxation rate, and are shown in FIG. 6.

Figure 6:
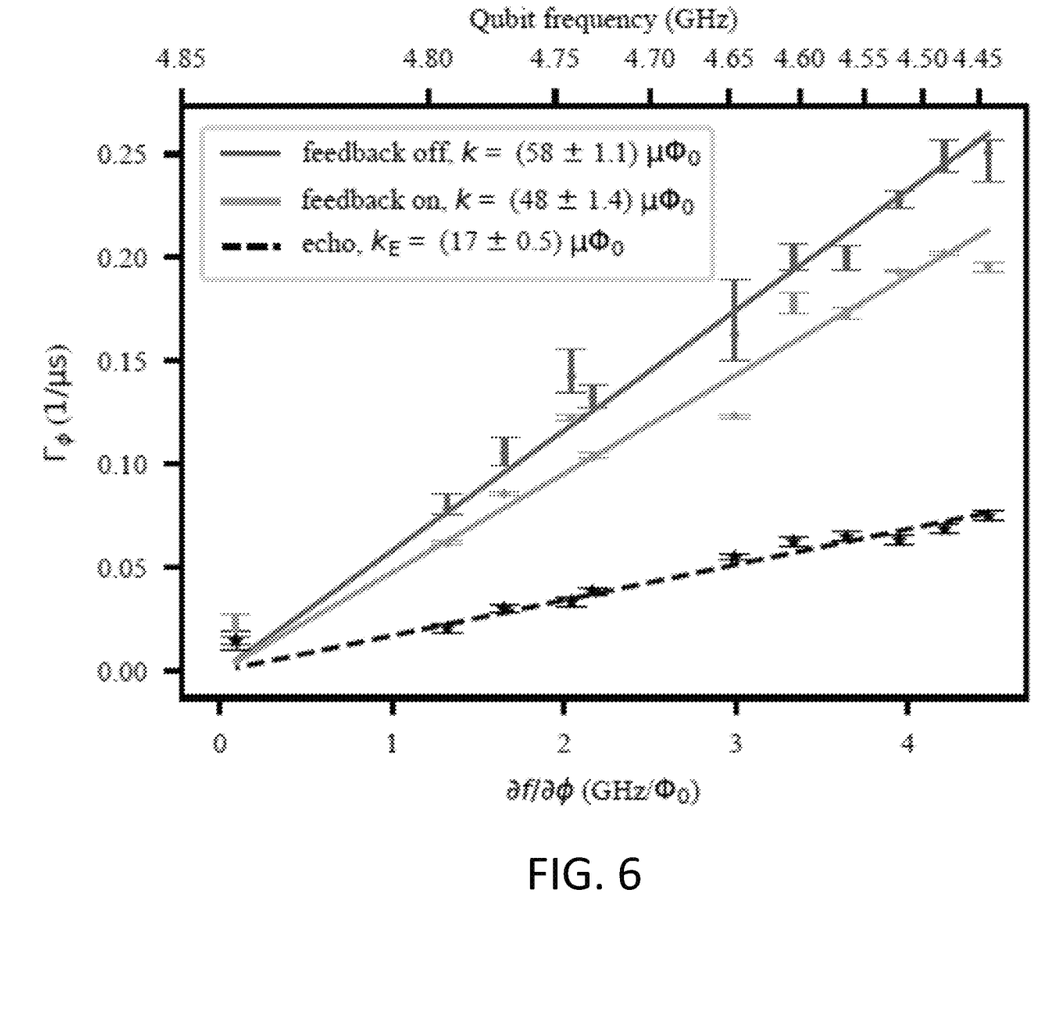
FIG. 6 is a plot of qubit coherence at different bias points in an experiment using an embodiment.

FIG. 6 is a plot of qubit coherence at different bias points in an experiment using an embodiment. The qubit dephasing rate $\Gamma_\phi$ is evaluated at several different bias fluxes. The qubit's sensitivity to flux noise increases further away from the sweet spot, resulting in reduced dephasing times (i.e. increased dephasing rates). The error bars show 68% confidence intervals for the median of the dephasing times measured 60 times. The solid lines show a linear fit to the dephasing rates with respect to the curvature of the qubit spectrum with respect to flux. The stars show the dephasing times extracted from a spin-echo experiment, used as a reference.

The measured dephasing rates shown in FIG. 6 are lowest close to the flux "sweet spot" and gradually increase away from this spot as the qubit sensitivity to the noise increases. In the limit where decoherence is dominated by flux noise, the envelope equation can be used to show that there is an (almost) linear dependence between the dephasing rate $\Gamma_\phi$ and the flux sensitivity of the qubit, $$\Gamma_\phi = k \left| \frac{\partial f_q}{\partial \Phi} \right|.$$

We found the coefficient k from a linear fit to the data in FIG. 6, and used the result to assess the impact of the feedback on mitigating the flux noise. Without the feedback $k=(58\pm1.1)\mu\Phi_0$, and reduced to $k=(48\pm1.4)\mu\phi_0$ when the feedback was used, an improvement of 17%. This implies that the feedback effectively reduces the flux noise amplitude seen by the qubit.

The ultimate goal is to suppress the low frequency noise to the level that the coherence time measured using a spin echo experiment (which is insensitive to low frequency noise) would be equal or higher than the coherence time in a feedback stabilized Ramsey experiment. In FIG. 6, the dephasing rate measured from an echo experiment is shown with stars, and the linear fit yields $k_E=(17\pm0.5)\mu\Phi_0$, which corresponds to the 1/f flux-noise amplitude of $\sqrt{A_\Phi}=(3.3\pm0.1)\mu\Phi_0$. The main reason why the impact of the noise on the echo experiment is lower than the on feedback-stabilized Ramsey experiment was the limited bandwidth of our feedback implementation. While the feedback efficiently suppresses the noise up to 1 kHz, the echo experiment was mostly insensitive to the noise below the inverse duration of a single echo experiment, here approximately −100 kHz.

Unlike the spin echo experiment, which is specifically designed to be insensitive to the low frequency qubit frequency fluctuations, many quantum algorithms or sequences of quantum gates are highly sensitive to small deviations in the qubit frequency. While there exist several open-loop control strategies for minimizing gate sensitivity to noise at different frequencies, they always come with an added cost in the duration of the gate sequence or complexity in calibration. The advantage of the feedback-based stabilization method described herein is that no changes to the gate sequences or controls are required.

Next, we demonstrate that the feedback protocol improves the single-qubit gate fidelity in our device. We biased the qubit 400 MHz away from the flux sweet spot so that it was highly sensitive to flux noise, and performed single-qubit randomized benchmarking while stabilizing the qubit frequency with the feedback. The qubit excited state population $p_1$ was determined as a function of number of Clifford gates in a random sequence, followed by a Clifford gate that would ideally bring the qubit back to the ground state. With the feedback both off and on, the experiment was repeated for 50 different random sequences, which were averaged and used to find the average error per gate. We found that the feedback reduces the average error per gate from $(8.5\pm2.1)\times10^{-4}$ to $(5.9\pm0.7)\times10^{-4}$, approaching the limit imposed by the energy-relaxation rate of the qubit. While such fidelities are commonly observed at or near the flux-insensitive point in some prior devices, it is unusual to see it so far from the sweet spot.

We attribute the reduction in the average gate error mostly to the improved stability of the qubit frequency. Without feedback, several of the random sequences show oscillating decay functions with the number of Clifford gates, indicative of coherent control errors, such as the quasi-static shifts in the qubit frequency due to the low frequency noise. In contrast, with the feedback activated, the function monotonically decays for all random sequences, something that is typical for incoherent errors. This observation is supported by another experiment, where we showed the gate errors inferred from randomized benchmarking experiments repeated 250 times with 7 different realizations of a random gate sequence, for a total duration of 840 s. Without the feedback, we observed a significant drift in the gate errors. With feedback turned on, the gate errors remained consistently low, indicating that the feedback successfully stabilized the drift and fluctuations in the qubit frequency. This was also manifested in lowered uncertainty in the fitted gate error.

Figure 7:
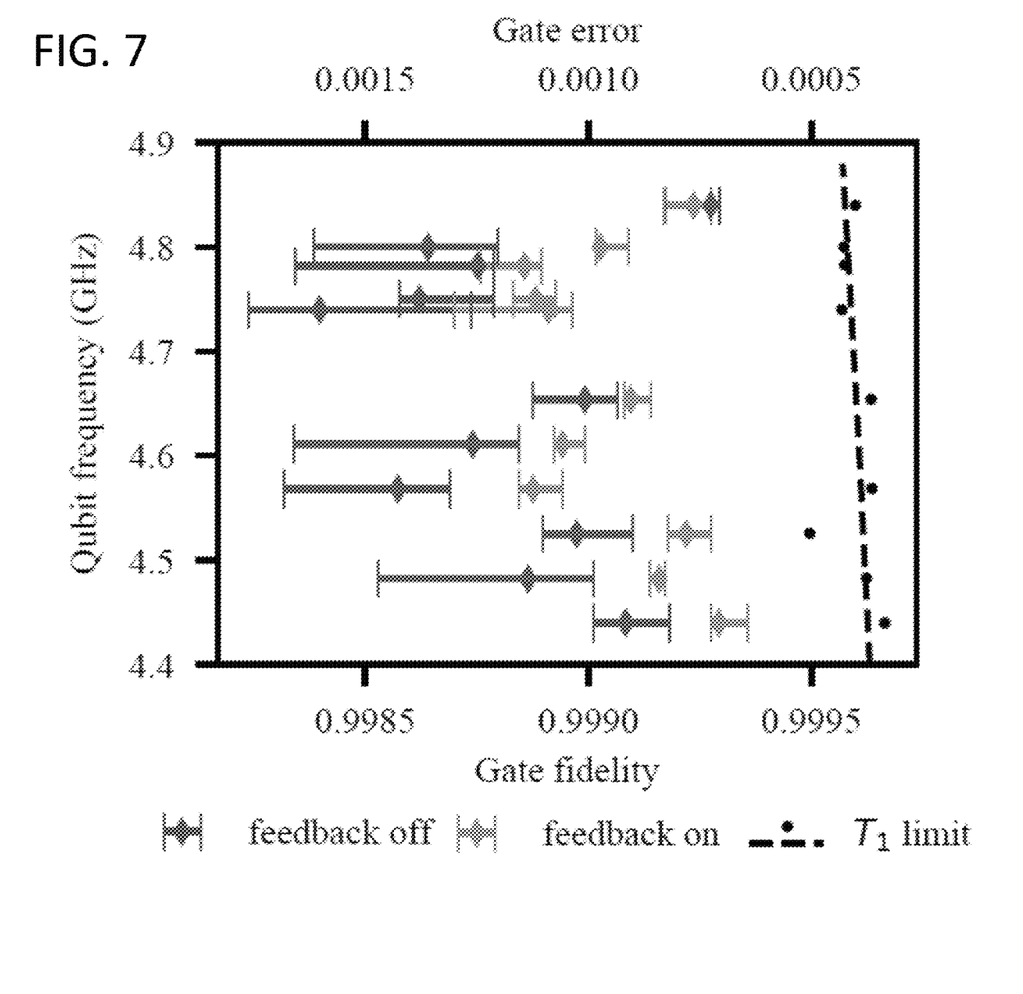
FIG. 7 shows randomized benchmarking of gate fidelity at several different qubit bias fluxes.

We observed a similar improvement on gate fidelity for all flux bias points with the exception of the sweet spot, see FIG. 7. In this Figure, black dots show the estimated coherence limit for the gate fidelities, inferred from energy relaxation time $T_1$ of the qubit. The dashed line shows a fit to the estimated coherence limits at the different operating points. At each flux point, we repeated the randomized benchmarking experiment 10 times with and without feedback, re-calibrating the qubit frequency between every repetition of the randomized benchmarking experiment. In contrast to the coherence time $T_2$ (which is the highest at the sweet sport and then consistently decreases as the flux noise sensitivity increases away from the sweet spot) the highest gate fidelities were in fact measured at the most flux-sensitive point we investigated.

We attribute the increasing trend in the fidelities at lower frequencies to the higher energy-relaxation time $T_1$ of the qubit. Additionally, spectrally moving parasitic two-level fluctuators reduced the best achievable single-qubit gate fidelities at certain bias points. Due to the coupling to the qubit, the changes in the frequencies of the two-level fluctuators caused shifts in the qubit frequency. As a result, at some bias points there were wide variations in the measured gate fidelities between different experiments. The variation is significantly reduced by the feedback. This highlights that the implemented feedback protocol can mitigate the impact of many sources of low-frequency noise, such as frequency shifts caused by two-level fluctuators.

In sum, we have implemented a closed-loop feedback protocol to stabilize the drift and fluctuations in the frequency of a superconducting transmon qubit. In the probing phase we use repeated Ramsey experiments to estimate the qubit frequency and adjust the qubit frequency to cancel the measured frequency offset. The probing phase can be interleaved with a computational workload such as algorithm execution.

We have demonstrated that the feedback stabilizes the qubit frequency fluctuations even when the qubit is not operated at the noise-insensitive operation point. This leads to reduction in the noise power observed by the qubit, resulting in improved coherence times and improved gate fidelities. The ability to operate qubits away from the protected bias point will help addressing the frequency crowding problem in large quantum processors by increasing the operable frequency band for the qubits. Additionally, the increased operable frequency band helps to avoid spurious modes arising for example from two-level fluctuators.

The feedback algorithm is agnostic to the source of the noise in the qubit frequency. The disclosed technique should work equally well on other low-frequency noise sources, such as charge noise or two-level system (TLS) induced shifts in the qubit frequency. Moreover, the feedback can rely only on single-qubit operations or two-qubit operations which implies that it can be extended to multi-qubit systems without additional cost in time or complexity.

It is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter.

In the foregoing detailed description, various features of embodiments are grouped together in one or more individual embodiments for the purpose of streamlining the disclosure. This method of disclosure is not to be interpreted as reflecting an intention that the claims require more features than are expressly recited therein. Rather, inventive aspects may lie in less than all features of each disclosed embodiment.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Use of ordinal terms such as "first," "second," "third," etc., in the specification to modify an element does not by itself connote any priority, precedence, or order of one element over another or the temporal order in which acts of a method are performed, but are used merely as labels to distinguish one element having a certain name from another element having a same name (but for use of the ordinal term) to distinguish the elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A closed-loop feedback system for maintaining a desired operating frequency of a qubit, the system comprising:
   a readout resonator that is capacitively coupled to the qubit, the readout resonator configured to produce a series of measurements of the operating frequency of the qubit;
   a frequency estimator configured to receive the series of measurements and responsively produce an estimate of an offset between a measured operating frequency of the qubit and the desired operating frequency of the qubit;
   an accumulator configured to receive the estimate of the offset and responsively produce an accumulated error signal;

an arbitrary waveform generator configured to receive the accumulated error signal and responsively generate a current; and an inductor that is inductively coupled to the qubit, the inductor receiving the generated current and responsively producing a magnetic flux, thereby actively controlling the operating frequency of the qubit.

2. The system according to claim 1, wherein the qubit comprises a superconducting charge or flux qubit.

3. The system according to claim 2, wherein the superconducting charge qubit comprises a transmon.

4. The system according to claim 1, wherein the readout resonator comprises a Ramsey interferometer.

5. The system according to claim 1, wherein the frequency estimator, or the accumulator, or both comprises a field-programmable gate array (FPGA).

6. The system according to claim 1, wherein the frequency estimator is configured to produce the estimate of the offset by subtracting the measured operating frequency of the qubit from the desired operating frequency of the qubit.

7. The system according to claim 6, wherein the frequency estimator is configured to produce the estimate of the offset by further subtracting a sampling noise produced by the readout resonator.

8. A method of maintaining a desired operating frequency of a qubit, the method comprising:

producing a series of measurements of the operating frequency of the qubit;

estimating an offset between a measured operating frequency of the qubit and the desired operating frequency of the qubit;

producing an accumulated error signal using the estimate of the offset; and inductively coupling a magnetic flux to the qubit according to the accumulated error signal, thereby actively controlling the operating frequency of the qubit.

9. The method according to claim 8, wherein the qubit comprises a superconducting charge or flux qubit.

10. The method according to claim 9, wherein the superconducting charge qubit comprises a transmon.

11. The method according to claim 8, wherein producing the series of measurements comprises performing Ramsey experiments.

12. The method according to claim 8, wherein estimating the offset comprises subtracting the measured operating frequency of the qubit from the desired operating frequency of the qubit.

13. The method according to claim 12, wherein estimating the offset comprises further subtracting a sampling noise produced by a readout resonator making the series of measurements.

14. The method according to claim 8, further comprising allowing a quantum state of the qubit to evolve according to a portion of a quantum computation.

15. The method according to claim 14, performed repetitively until the quantum computation is complete.

\* \* \* \* \*